US008622073B2

(12) United States Patent
Satake (10) Patent No.: US 8,622,073 B2
(45) Date of Patent: Jan. 7, 2014

(54) APPARATUS AND METHOD FOR CONTROLLING FLOW RATE OF LIQUID, AND STORAGE MEDIUM

(75) Inventor: Keigo Satake, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 98 days.

(21) Appl. No.: 13/281,617

(22) Filed: Oct. 26, 2011

(65) Prior Publication Data

US 2012/0111412 A1    May 10, 2012

(30) Foreign Application Priority Data

Nov. 4, 2010    (JP) ................................ 2010-247705

(51) Int. Cl.
*G05D 11/00*        (2006.01)
(52) U.S. Cl.
USPC ....................... 137/111; 137/486; 137/599.07
(58) Field of Classification Search
USPC ......... 137/110, 111, 114, 486, 487.5, 599.01, 137/599.04, 599.06, 599.07, 601.14
See application file for complete search history.

(56) References Cited

U.S. PATENT DOCUMENTS

| | | | | |
|---|---|---|---|---|
| 1,757,059 A | * | 5/1930 | Rickenberg | 137/637 |
| 3,875,964 A | * | 4/1975 | Friedland | 137/599.07 |
| 4,191,215 A | * | 3/1980 | Gonner | 137/870 |
| 4,207,919 A | * | 6/1980 | Hutton | 137/487.5 |
| 4,577,658 A | * | 3/1986 | Bosteels et al. | 137/599.07 |
| 4,719,941 A | * | 1/1988 | Moser | 137/599.07 |
| 5,038,821 A | * | 8/1991 | Maget | 137/486 |
| 5,329,965 A | * | 7/1994 | Gordon | 137/599.07 |
| 5,875,817 A | * | 3/1999 | Carter | 137/599.06 |
| 6,234,204 B1 | * | 5/2001 | van den Wildenberg | 137/599.07 |
| 6,240,944 B1 | * | 6/2001 | Ohnstein et al. | 137/1 |
| 6,767,402 B2 | * | 7/2004 | Takamatsu et al. | 117/86 |

FOREIGN PATENT DOCUMENTS

| | | |
|---|---|---|
| JP | S57-005507 A | 1/1982 |
| JP | S58-070319 A | 4/1983 |
| JP | S63-51638 A | 4/1988 |
| JP | H01-214911 A | 8/1989 |
| JP | 2001-175336 A | 6/2001 |
| JP | 2002-116824 A | 4/2002 |
| JP | 2003-158122 A | 5/2003 |

* cited by examiner

*Primary Examiner* — Stephen M Hepperle
*Assistant Examiner* — R. K. Arundale
(74) *Attorney, Agent, or Firm* — Abelman, Frayne & Schwab (57) ABSTRACT

The liquid flow rate control apparatus includes a first flow rate control unit which includes a first flow rate control valve for a small flow rate with a first controlled flow rate range, and a second flow rate control unit which includes a second flow rate control valve for a large flow rate with a second controlled flow rate range. In particular, an overlapped range is present between the first and second controlled flow rate ranges and a liquid flows on either any one or both of the first and second flow rate control units depending on variation of a required value of a total rate. The flow rate on any one of the first and second flow rate control units is maintained and the flow rate on the other one increases while increasing the total flow rate of the liquids.

17 Claims, 4 Drawing Sheets

APPARATUS AND METHOD FOR CONTROLLING FLOW RATE OF LIQUID, AND STORAGE MEDIUM

CROSS-REFERENCE TO RELATED APPLICATIONS

This application is based on and claims priority from Japanese Patent Application No. 2010-247705, filed on Nov. 4, 2010, with the Japanese Patent Office, the disclosure of which is incorporated herein in its entirety by reference.

TECHNICAL FIELD

The present disclosure relates to a technology for controlling a flow rate of a liquid, and more particularly, to a technology that makes a plurality of flow rate control units with different controllable flow rate ranges cooperate with each other.

BACKGROUND

In manufacturing a semiconductor device, a cleaning system is employed in order to perform a cleaning before diffusion/CVD processing, a cleaning after etching, and a wet etching. The cleaning system has been highly integrated in recent years in order to meet requirements for a small footprint and a high throughput, such that a plurality of cleaning units are included in one cleaning processing system.

Although an exclusive cleaning liquid supply unit may be installed in each of the cleaning units, a common cleaning liquid supply unit is generally installed with respect to the plurality of cleaning units. A cleaning liquid is generally generated by mixing one kind or a plurality of kinds of highly concentrated chemical solutions with deionized water (DIW). While the cleaning liquid is generated in advance to be stored in a tank, the cleaning liquid may be supplied from the tank as necessary. However, in recent years, the chemical solutions-DIW mixing has been performed at the time of supplying a processing liquid. The plurality of cleaning units is operated according to a predetermined process schedule, and the number of cleaning units using the cleaning liquid varies every moment. There may be a case either only one cleaning unit uses the cleaning liquid, or all cleaning units use the cleaning liquid. In particular, since the chemical solution is highly corrosive, a flow rate control apparatus in which at least a liquid contacting portion is made of a chemical-resistant resin material needs to be used and a flow rate regulation range thereof is generally very narrow. Accordingly, if the number of cleaning units included in one cleaning processing system increases, the flow rate control apparatus for the chemical solution with the narrow flow regulating range has difficulty in dealing with the variations of a flow rate of the required chemical solution.

According to user's requirements, one cleaning liquid supply unit may be required to supply a relatively low-concentration cleaning liquid (for example, DHF of HF:DIW=1:200) and a relatively high-concentration cleaning liquid (for example, DHF of HF:DIW=1:10). Further, one cleaning liquid supply unit may be required to supply different types of cleaning liquids (for example, DHF, SC1, and SC2). In this case, the flow rate control apparatus for the chemical solution with the narrow flow regulating range becomes more difficult to deal with variations of the flow rate of the required chemical solution. As an example, the flow rate control apparatus for the chemical solution may have to deal with a wide range in the flow rate of the chemical solution in the range of approximately 10 ml/min to 2800 ml/min.

Japanese Patent Application Laid-Open Publication No. 2003-158122 discloses a technique in which two flow rate controllers having different controllable flow rate ranges and installed in parallel are used in order to supply a liquid raw material in a CVD device. However, Japanese Patent Application Laid-Open Publication No. 2003-158122 does not at all disclose controlling of two flow rate controllers which can deal with the variations in the required flow rate.

SUMMARY

An exemplary embodiment of the present disclosure provides an apparatus for controlling a flow rate of a liquid, including: a plurality of flow rate control units installed in parallel; and a controller configured to control the plurality of flow rate control units so that a total flow rate of liquids that flows on the plurality of flow rate control units becomes equivalent to a required value of a total flow rate to be implemented by the plurality of flow rate control units. In particular, the plurality of flow rate control units include at least a first flow rate control unit and a second flow rate control unit, the first flow rate control unit includes a first flow rate control valve with a first controlled flow rate range, the second flow rate control unit includes a second flow rate control valve with a second controlled flow rate range, the first controlled flow rate range is smaller than the second controlled flow rate range, and a duplicate range is present between the first controlled flow rate range and the second controlled flow rate range. Moreover, the controller is configured to control the first and second flow rate control units to allow the liquid to flow on either one or both of the first and second flow rate control units depending on variation of the required value of the total flow rate, and the controller is configured to control the first and second flow rate control units to increase the flow rate that flows on one of the first and second flow rate control units while maintaining the flow rate on the other of the flow rate control units during the course of increasing the total flow rate of the liquid that flows on the first and second flow rate control units.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

The present disclosure has been made in an effort to provide an apparatus for controlling a flow rate of a liquid, which can deal with a wide range of required flow rate.

A first exemplary embodiment of the present disclosure provides an apparatus for controlling a flow rate of a liquid, including: a plurality of flow rate control units installed in parallel; and a controller configured to control the plurality of flow rate control units so that a total flow rate of liquids that flows on the plurality of flow rate control units becomes a required value of a total flow rate to be implemented by the plurality of flow rate control units. In particular, the plurality of flow rate control units include at least a first flow rate control unit and a second flow rate control unit, the first flow rate control unit includes a first flow rate control valve with a first controlled flow rate range, the second flow rate control unit includes a second flow rate control valve with a second controlled flow rate range, the first controlled flow rate range is smaller than the second controlled flow rate range, and an overlapped range is present between the first controlled flow rate range and the second controlled flow rate range. Moreover, the controller is configured to control the first and second flow rate control units to allow the liquid to flow on either one or both of the first and second flow rate control units depending on variation of the required total flow rate, and the controller is configured to control the first and second flow rate control units to increase the flow rate at one of the first and second flow rate control units while maintaining the flow rate at the other of the flow rate control units during the course of increasing the total flow rate of the liquid that flows on the first and second flow rate control units.

In a first aspect of the first exemplary embodiment, while increasing the total flow rate of the first and second flow rate control units from a first state in which the liquid only flows on the second flow rate control unit, when the flow rate of the first flow rate control unit, that corresponds to the total flow rate increases up to a first value within the overlapped range, the controller is configured to control the first and second flow rate control units so that the first state is changed to a second state in which the liquid flows both on the first and second flow rate control units. In this state, the flow rate of the first flow rate control unit decreases and the liquid starts to flow onto the second flow rate control unit so as not to change the total flow rate of the first and second flow rate control units.

In a second aspect of the first exemplary embodiment, while increasing the total flow rate of the first and second flow rate control units, when changing the first state to the second state, the controller is configured to control the first and second flow rate control units so as to decrease the flow rate of the first flow rate control unit as much as an amount corresponding to a lower limit value of the second controlled flow rate range.

In a third aspect of the first exemplary embodiment, while increasing the total flow rate of the first and second flow rate control units again after changing the first state to the second state, the controller is configured to control the first and second flow rate control units so as to increase the flow rate of the second flow rate control unit after increasing the flow rate of the first flow rate control unit to a value corresponding to an upper limit value of the first controlled flow rate range.

In a fourth aspect of the first exemplary embodiment, while decreasing the total flow rate of the first and second flow rate control units from the second state, when the total flow rate of the first and second flow rate control units decreases up to a second value within the overlapped range smaller than the first value, the controller is configured to control the first and second flow rate control units so that the second state is changed to the first state. In this state, the flow rate of the first flow rate control unit increases and the flow of liquid onto the second flow rate control unit stops so as not to change the total flow rate of the first and second flow rate control units.

In a fifth aspect of the first exemplary embodiment, while decreasing the total flow rate of the first and second flow rate control units, when changing the second state to the first state, the controller is configured to control the first and second flow rate control units so as to decrease the flow rate of the second flow rate control unit to the value corresponding to the lower limit value of the second controlled flow rate range and increase the flow rate of the first flow rate control unit as much as the amount corresponding to the lower limit value of the second controlled flow rate range.

In a sixth aspect of the first exemplary embodiment, the lower limit value of the second controlled flow rate range is equal to one half ($\frac{1}{2}$) of the upper limit value of the first controlled flow rate range.

In a seventh aspect of the first exemplary embodiment, the plurality of flow rate control units further include a third flow control unit, the third flow rate control unit includes a third flow rate control valve with a third controlled flow rate range, and the third controlled flow rate range is larger than the second controlled flow rate range and has an overlapped range with the second controlled flow rate range or is smaller than the first controlled flow rate range and has an overlapped range with the first controlled flow rate range.

The apparatus for controlling a flow rate of a liquid further includes a common liquid supply unit supplying the liquid to the plurality of flow rate control units installed in parallel, wherein each flow rate control unit includes a pipe, a flowmeter and a flow rate control valve installed on the pipe, and a controller controlling an opening degree of the flow rate control valve to achieve a target flow rate based on a deviation between the target flow rate provided from the controller and a measurement value of the flowmeter. Further, the each flow rate control unit further includes an opening/closing valve installed on the pipe and the flow rate control valve is a needle valve.

A second exemplary embodiment of the present disclosure provides a substrate processing apparatus including: a plurality of liquid processing units each configured to process a substrate by using a processing liquid; and a common processing liquid supply device supplying the processing liquid to the plurality of liquid processing units. The processing liquid supply device includes a diluted liquid supply source, a pipe connecting the plurality of liquid processing units, and a liquid flow rate control apparatus connected to the pipe. Further, the processing liquid supply device is configured to perform liquid processing in the plurality of liquid processing units with a mixed liquid of a diluted liquid and a chemical solution of which the flow rate is controlled by the liquid flow rate control apparatus as the processing liquid.

A third exemplary embodiment of the present disclosure provides a method for controlling a flow rate of a liquid by using a plurality of flow rate control units, which includes at least a first flow rate control unit and a second flow rate control unit installed in parallel, so that a total flow rate of the liquid that flows on the plurality of flow rate control units becomes equivalent to a required value of the total flow rate to be implemented by the plurality of flow rate control units, in which the first flow rate control unit includes a first flow rate control valve with a first controlled flow rate range, the second flow rate control unit includes a second flow rate control valve with a second controlled flow rate range, the first controlled flow rate range is smaller than the second controlled flow rate range, and an overlapped range is present between the first controlled flow rate range and the second controlled flow rate range. The method includes flowing the liquid on either any one or both of the first and second flow rate control units depending on the change of the required value of the total flow rate to be implemented by the plurality of flow rate control units; and maintaining the flow rate that flows on any one of the first and second flow rate control units and increasing the flow rate that flows on the other one while increasing the total flow rate of the liquids that flows on the first and second flow rate control units increases.

A fourth exemplary embodiment of the present disclosure provides a computer-readable storage medium storing a program for controlling a liquid flow rate control apparatus including a plurality of flow rate control units, which includes at least a first flow rate control unit and a second flow rate control unit installed in parallel, in which the first flow rate control unit includes a first flow rate control valve with a first controlled flow rate range, the second flow rate control unit includes a second flow rate control valve with a second controlled flow rate range, the first controlled flow rate range is smaller than the second controlled flow rate range and an overlapped range is present between the first controlled flow rate range and the second controlled flow rate range, in which the program, when executed by a control computer, controls the plurality of flow rate control units to perform the steps of controlling a total flow rate of liquids that flows on the plurality of flow rate control units to become equivalent to a required value of a total flow rate to be implemented by the plurality of flow rate control units; flowing the liquid on either any one or both of the first and second flow rate control units depending on variation of the required value of the total flow rate to be implemented by the plurality of flow rate control units; and maintaining the flow rate that flows at one side of the first and second flow rate control units and increasing the flow rate that flows at the other side is increased while increasing the total flow rate of the liquids that flows on the first and second flow rate control units.

In the second, third and fourth exemplary embodiments, the first to seventh aspects of the first exemplary embodiment may be adopted. Further, the first to seventh aspects may be appropriately combined with each other.

According to the exemplary embodiments of the present disclosure, by combining and using a plurality of flow rate control units with different controlled flow rate ranges, the controllable flow rate range can be variously widened throughout the liquid flow rate control apparatus.

Figure 1:
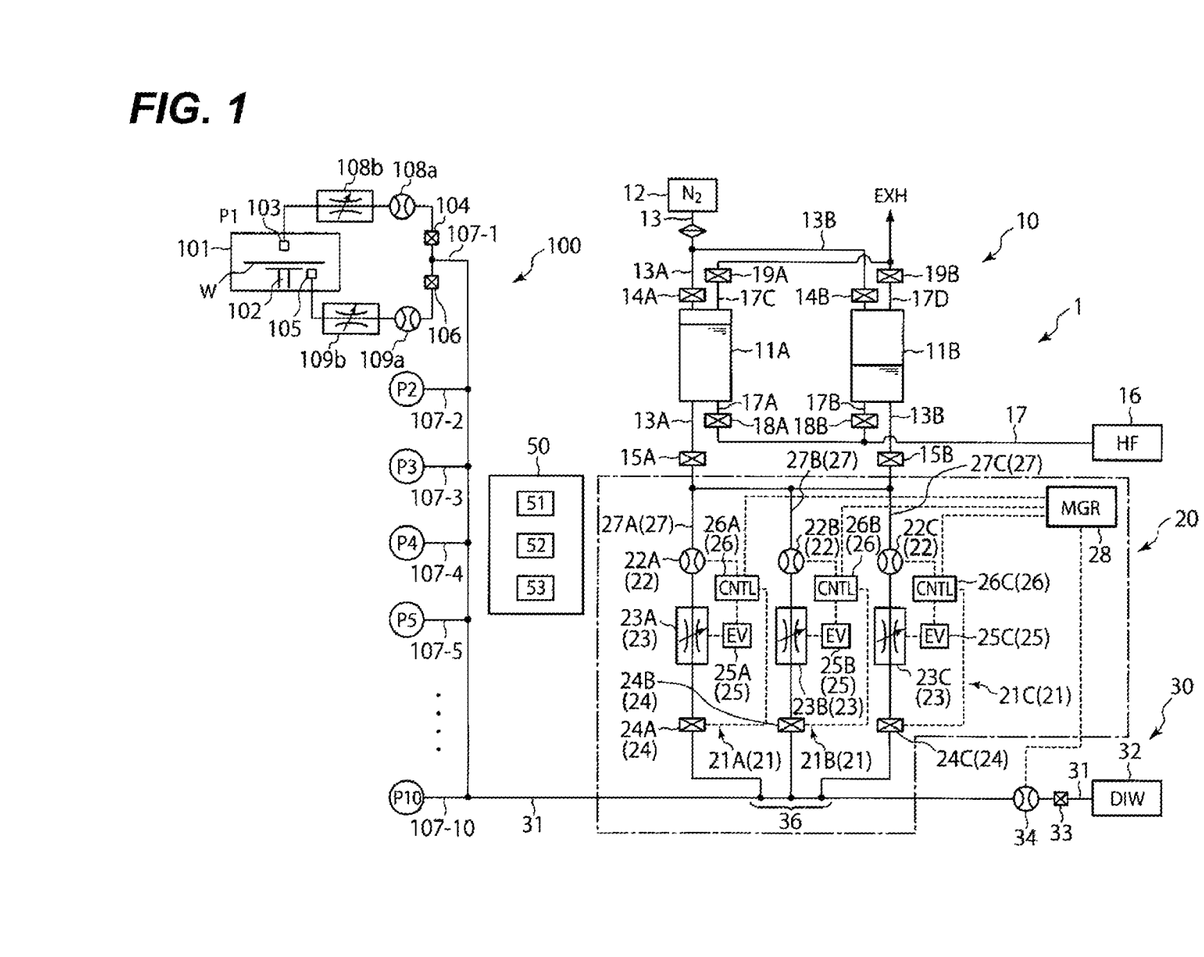
FIG. 1 is a diagram illustrating a configuration of a cleaning processing system including a cleaning liquid supplying block with a liquid flow rate control apparatus according to an exemplary embodiment of the present disclosure.

Exemplary embodiments of the present disclosure will be described with reference to the accompanying drawings. As shown in FIG. 1, a cleaning processing system includes a cleaning liquid supplying block 1 and a cleaning processing block 100.

Cleaning processing block 100 includes a plurality of, for example, ten (10) cleaning units P1 to P10. The specifications of cleaning units P1 to P10 are the same as each other. Cleaning unit P1 includes a casing 101, a spin chuck 102 installed in casing 101 and holding a substrate, for example, a semiconductor wafer (hereinafter, simply referred to as a 'wafer') W, a cleaning liquid nozzle 103 supplying a cleaning liquid (a diluted chemical solution in this example) onto the surface of wafer W, and a cleaning liquid nozzle 105 supplying the cleaning liquid on a rear surface of wafer W. The supplying of the cleaning liquid to cleaning liquid nozzle 103 is controlled by an opening/closing valve 104 and a flow rate controlling mechanism including a flow meter 108*a* and a flow rate control valve 108*b* that are positioned at the downstream side thereof. The supplying of the cleaning liquid to cleaning liquid nozzle 105 is controlled by an opening/closing valve 106 and a flow rate controlling mechanism including a flow meter 109*a* and a flow rate control valve 109*b* that are positioned at the downstream side thereof. Processing liquid supplying pipes 107_1 to 107_10 to each of cleaning units P1 to P10 are connected in parallel to a pipe 31 of cleaning liquid supplying block 1 to be described below. Since cleaning devices for manufacturing a semiconductor device, such as cleaning units P1 to P10 are known to those skilled in the art, a detailed description thereof will be omitted. Cleaning units P1 to P10 operate at temporal intervals from each other according to a predetermined processing schedule. That is, cleaning processing block 100 is a processing liquid consumption structure of processing liquid in which the processing liquid consumption (even the concentration of the processing liquid in some cases) varies as time elapses.

Cleaning liquid supplying block 1 includes a chemical solution supply unit 10, a chemical solution flow rate control unit (flow rate control apparatus) 20, and a diluted liquid supply unit 30.

Chemical solution supply unit 10 includes two tanks 11A and 11B installed in parallel and storing a chemical solution. A pipe 13 is connected to a pump transportation pressurized gas source 12 such as, for example, an $N_2$ gas source, and pipe 13 is branched on the way to become branch pipes 13A and 13B. Each of tanks 11A and 11B is installed on branch pipes 13A and 13B, respectively. Opening/closing valves 14A, 15A, 14B and 15B are installed at the upstream side and the downstream side of tanks 11A and 11B of branch pipes 13A and 13B, respectively. Further, a pipe 17 is connected to a large-capacity chemical solution supplying source 16 such as, for example, a hydrofluoric acid (HF) supplying source, and pipe 17 is branched on the way to become branch pipes 17A and 17B. Each of branch pipes 17A and 17B is connected to lower parts of tanks 11A and 11B, respectively. Each of opening/closing valves 18A and 18B is installed on branch pipes 17A and 17B, respectively. Each of pipes 17C and 17D is connected to upper parts of tanks 11A and 11B, respectively, and each of opening/closing valves 19A and 19B is installed on pipes 17C and 17D, respectively.

In general, during operation, in chemical solution supply unit 10, only any one group of opening/closing valves 14A and 15A and 14B and 15B is opened, and pressurized gas is supplied to an upper space of any one (e.g., 11A) of two tanks 11A and 11B, and the chemical solution stored in the tank is pushed to be discharged (pressurized to be fed) from the bottom of the chemical solution to supply the chemical solution to flow rate control unit 20. When a remaining amount of the liquid chemical in any one tank gradually decreases, opening/closing valves 14A, 15A, 14B, and 15B are appropriately switched to supply the chemical solution to flow rate control unit 20 from the other tank (e.g., 11B). Further, for the any one tank, only any one group (for example, opening/closing valves 18A and 19A) of opening/closing valves 18A, 19A, 18B, and 19B is opened and the chemical solution is refilled in the any one tank from large-capacity chemical solution supplying source 16. When the chemical solution is refilled in the tank, the tank may be exposed to atmosphere or a factory exhaust system (EXH) by opening opening/closing valve 19A or 19B of corresponding pipe 17C or 17D in order to discharge gas contained in the tank.

As described above, the pressurized chemical solution is supplied to flow rate control unit 20 through corresponding branch pipe 13A or 13B from any one tank 11A or 11B.

A plurality of, for example, three (3) flow rate control units 21 (21A, 21B, and 21C) are installed in flow rate control unit

20. Control units 21 (21A, 21B, and 21C) include pipes 27 (27A, 27B, and 27C). Flow meters 22 (22A, 22B, and 22C), flow rate control valves 23 (23A, 23B, and 23C) of which opening degrees are controlled by electropneumatic regulators (EV) 25 (25A, 25B, and 25C), and opening/closing valves 24 (24A, 24B, and 24C) including air operation valves, are sequentially installed from the upstream side. In the exemplary embodiment, flow rate control valve 23 includes a needle valve in which at least a liquid contacting portion is all made of a high chemical-resistant material such as a hydrofluoric resin. Since it is difficult to completely set the flow rate passing through the needle valve to zero (0), opening/closing valves 24 are closed when the flow rate of each of flow rate control units 21A, 21B, and 21C is completely zero (0). The flow rate of the chemical solution on pipe 27 is detected by flow meter 22, a detection value is sent to controllers (CNTL) 26 (26A, 26B, and 26C). Controllers 26 send control signals to electropneumatic regulators 25 to achieve a target flow rate received from an upper level controller (MGR) 28 to control the opening degrees of flow rate control valves 23. That is, feedback groups controlling the opening degrees of flow rate control valves 23 are set to three flow rate control units 21A, 21B, and 21C, respectively, so that upper level controller 28 achieves target flow rates set with respect to each of three flow rate control units 21A, 21B, and 21C.

Three flow rate control units 21A, 21B, and 21C have specifications of flow rate control valves 23 (23A, 23B, and 23C) in which controllable flow rate ranges are different from each other. The controllable flow rate ranges refer to flow rate ranges which can achieve the target flow rate as, for example, an error range of ±1%. A lower limit value of a controllable flow rate range of the resin-made needle valve is approximately one tenth (1/10) of an upper limit value. In the exemplified embodiment, the controllable flow rate range of flow rate control valve 23A for a small flow rate is in the range of 10 ml/min to 100 ml/min, the controllable flow rate range of flow rate control valve 23B for a medium flow rate is in the range of 50 ml/min to 500 ml/min, and the controllable flow rate range of flow rate control valve 23C for a large flow rate is in the range of 250 ml/min to 2500 ml/min. That is, the controllable flow rate ranges of flow rate control valve 23A for the small flow rate and flow rate control valve 23B for the medium flow rate have an overlapped range, and further, the controllable flow rate ranges of flow rate control valve 23B for the medium flow rate and flow rate control valve 23C for the large flow rate have the overlapped range.

The controlled flow rate range is set to each flow rate control valve 23 (23A, 23B, or 23C). The 'controlled flow rate range' refers to a flow rate range actually used during operating in the 'controllable flow rate range' of each flow rate control valve 23 and the controlled flow rate range is determined by a designer or a user of the device. For example, the controlled flow rate range of 15 ml/min to 95 ml/min may be set with respect to flow rate control valve 23A for a small flow rate with the controllable flow rate range of 10 ml/min to 100 ml/min. Further, for example, the controlled flow rate range of 10 ml/min to 100 ml/min may be set with respect to flow rate control valve 23A for a small flow rate with the controllable flow rate range of 8 ml/min to 120 ml/min. In an exemplary embodiment described below, the controlled flow rate range is set similarly as the controllable flow rate range. Therefore, the controlled flow rate range of flow rate control valve 23A for the small flow rate is in the range of 10 ml/min to 100 ml/min, the controlled flow rate range of flow rate control valve 23B for the medium flow rate is in the range of 50 ml/min to 500 ml/min, and the controlled flow rate range of flow rate control valve 23C for the large flow rate is in the range of 250 ml/min to 2500 ml/min. That is, the controlled flow rate ranges of flow rate control valve 23A for the small flow rate and flow rate control valve 23B for the medium flow rate have the overlapped range and further, the controlled flow rate ranges of flow rate control valve 23B for the medium flow rate and flow rate control valve 23C for the large flow rate have the overlapped range.

In the exemplary embodiment, one half (1/2) of the upper limit value of the controlled flow rate range of flow rate control valve 23A for the small flow rate is set as the lower limit value of the controlled flow rate range of flow rate control valve 23B for the medium flow rate. Further, one half (1/2) of the upper limit value of the controlled flow rate range of flow rate control valve 23B for the medium flow rate is set as the lower limit value of the controlled flow rate range of flow rate control valve 23C for the large flow rate. This relationship is appropriate in implementing a simple control (a detailed description thereof will be made below).

An upstream end of diluted liquid supply unit 30 has pipe 31 connected to a deionized water (DIW) supplying source 32, and opening/closing valve 33 and flowmeter 34 are installed on pipe 31 sequentially from the upstream side. A downstream end of pipe 27 of three flow rate control units 21A, 21B, and 21C is connected to an area 36 of pipe 31.

The cleaning processing system includes a system controller 50 that controls an overall operation thereof. System controller 50 controls operations of all functional components (various valves of chemical solution supply unit 10, flow rate control unit (flow rate control apparatus) 20, and diluted liquid supply unit 30) of cleaning liquid supplying block 1 and operations of all functional components (for example, spin chuck 102, processing liquid supplying control valves 104 and 106, and a transportation arm (not shown) that carries wafer W in each of cleaning units P1 to P10) of processing block 100. System controller 50 even serves as an upper level controller of controller 28 of flow rate control unit (flow rate control apparatus) 20 of cleaning liquid supplying block 1. System controller 50 may be implemented by, for example, a general-purpose computer as hardware and a program (a device controlling program and a processing recipe) for operating the computer as software. The software is stored in a storage medium such as a hard disk drive fixedly installed in the computer or stored in a storage medium installed detachably to the computer, such as a CD-ROM, a DVD, or a flash memory. The storage medium is represented by reference numeral 51. A processor 52 calls and executes a predetermined processing recipe from storage medium 51 based on an instruction from a user interface 53 as necessary to perform predetermined processing under the control by system controller 50.

Next, an operation will be described. System controller 50 allows each of cleaning units P1 to P10 to perform cleaning processing based on a predetermined processing schedule of cleaning units P1 to P10. That is, wafer W is carried into each of cleaning units P1 to P10 by the transportation arm (not shown) to be held horizontally by spin chuck 102. Wafer W held by spin chuck 102 rotates around a vertical axial line. The cleaning liquid (in the present exemplary embodiment, the cleaning liquid is the chemical solution diluted with a liquid such as the DIW) is supplied to rotating wafer W from cleaning liquid nozzles 103 and 105, and predetermined cleaning processing is performed with respect to wafer W by using the cleaning liquid. After the cleaning processing is completed, wafer W is carried out from each of cleaning units P1 to P10 by the transportation arm (not shown).

System controller 50 provides to upper level controller 28 of flow rate control unit 20 information on a compounding ratio (the amount of the chemical solution/the amount of the DIW) of the cleaning liquid which cleaning liquid supplying block 1 will supply to processing block 100 based on the predetermined processing schedule of cleaning units P1 to P10 or based on an actual operational situation of cleaning units P1 to P10. Upper level controller 28 calculates a chemical solution supplying amount (the amount of the chemical solution supplied to area 36 of pipe 31 through flow rate control unit 20) required for acquiring a predetermined compounding ratio based on the flow rate of the DIW on pipe 31, which is measured by flow meter 34 and controls flow rate control unit 20 based on the calculated value. That is, upper level controller 28 provides required values of the flow rate of the chemical solution passing through each of flow rate control valves 23A, 23B, and 23C to each of lower level controllers 26 (26A, 26B, and 26C) of three flow rate control units 21A, 21B, and 21C, respectively, to implement the operation to be described below based on a requirement value of a total flow rate of the chemical solution (HF) provided from system controller 50. System controller 50 may be configured to directly send the command to lower level controllers 26 of three flow rate control units 21A, 21B, and 21C, respectively.

Figure 2:
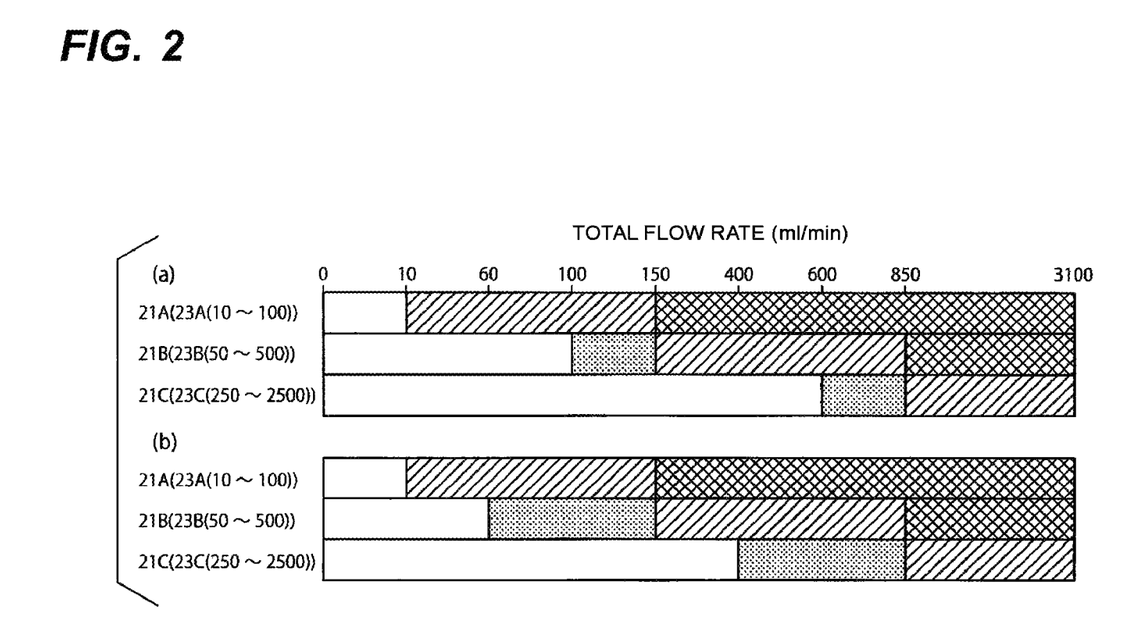
FIG. 2 is a chart diagram illustrating an operation of a liquid flow rate control apparatus.
Figure 3:
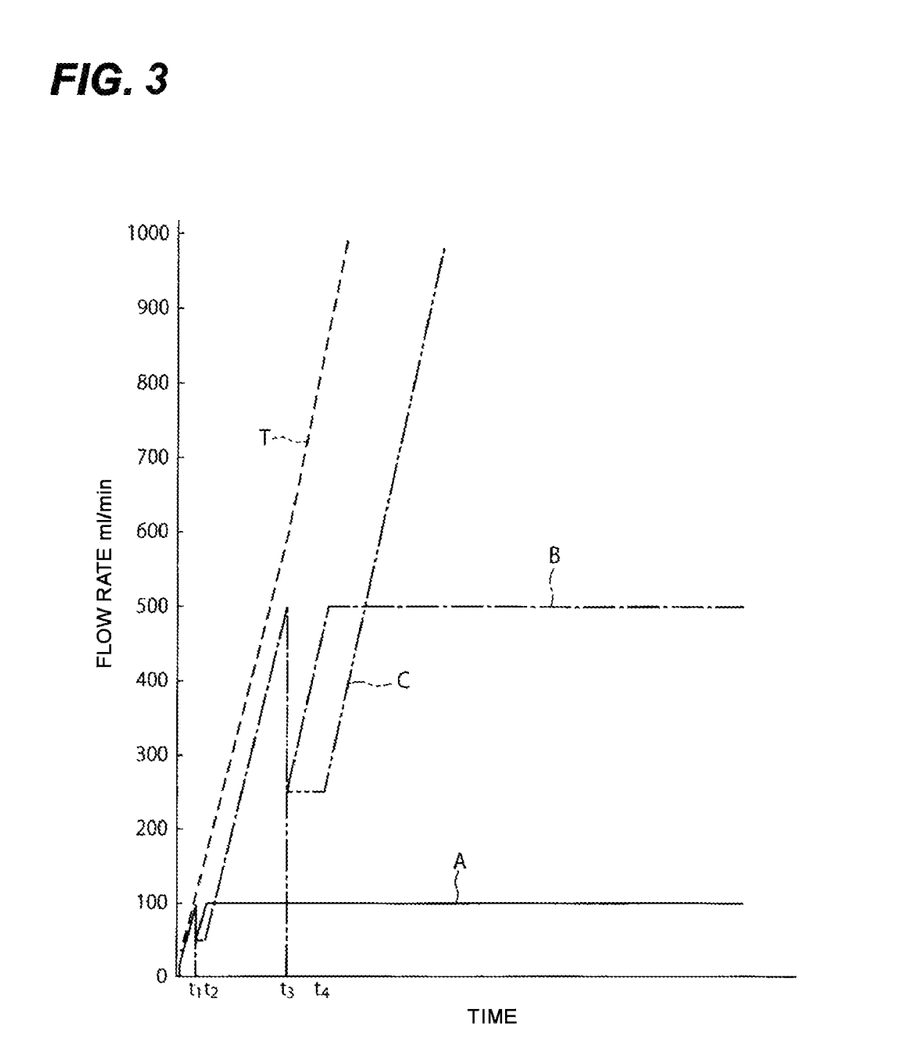
FIG. 3 is a graph illustrating the operation of the liquid flow rate control apparatus.
Figure 4:
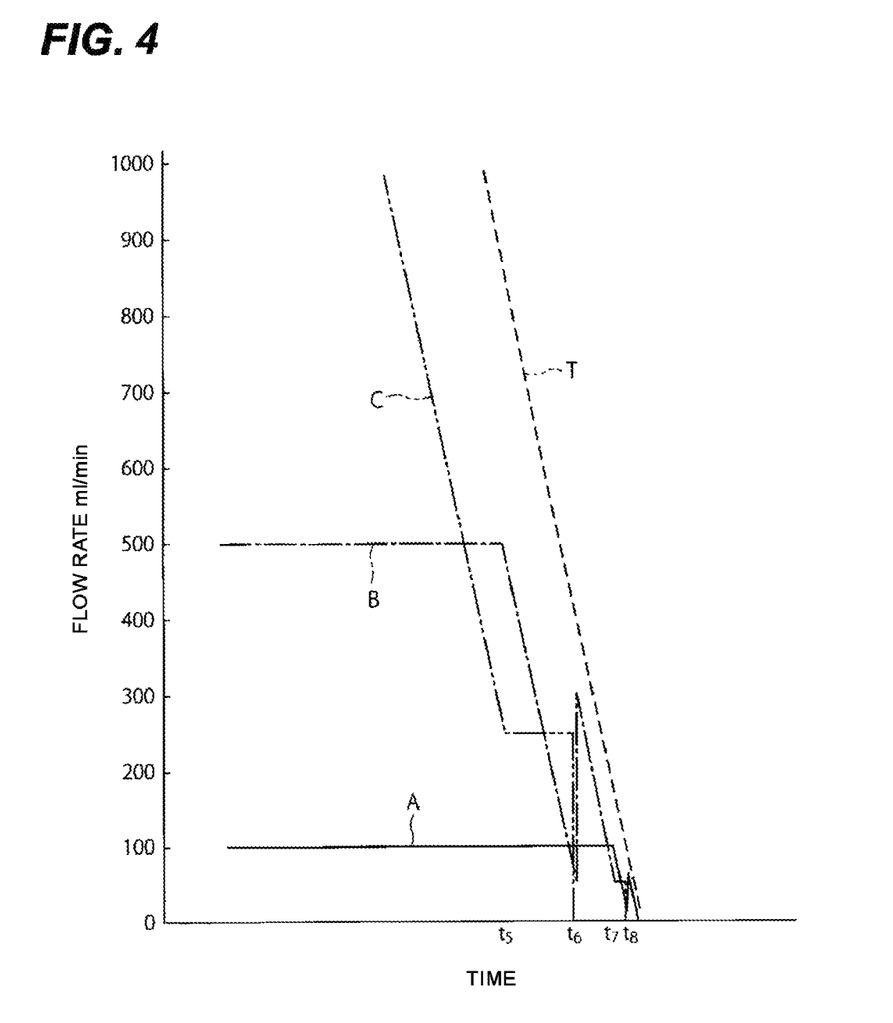
FIG. 4 is a graph illustrating the operation of the liquid flow rate control apparatus.

FIGS. 2, 3, and 4 illustrate how the total flow rate of the chemical solution is shared by three flow rate control units 21A, 21B, and 21C. As described above, in the exemplified embodiment, the controlled flow rate range of flow rate control valve 23A for the small flow rate is in the range of 10 ml/min to 100 ml/min, the controlled flow rate range of flow rate control valve 23B for the medium flow rate is in the range of 50 ml/min to 500 ml/min, and the controlled flow rate range of flow rate control valve 23C for the large flow rate is in the range of 250 ml/min to 2500 ml/min.

In a chart of FIG. 2, a white part represents a state in which a liquid does not flow in corresponding flow rate control unit 21. Specifically, for example, the chart of FIG. 2 represents a state in which an opening degree of corresponding flow rate control valve 23 is a predetermined value corresponding to a flow rate which is the lower limit value or less of the controlled flow rate range (for example, when the controlled flow rate range is in the range of 50 ml/min to 500 ml/min, for example, 30 ml/min) and opening/closing valve 24 positioned downstream thereof is closed.

A dotted part represents a state in which a predetermined flow rate of liquid set to corresponding flow rate control unit 21 is being flowed. Specifically, for example, the dotted part represents a state in which the opening degree of flow rate control valve 23 is controlled so that the flow rate of the chemical solution on corresponding flow rate control valve 23 is maintained to the lower limit value of the controlled flow rate range, and opening/closing valve 24 positioned downstream thereof is opened.

A diagonal line part represents a state in which the flow rate is changed based on the flow rate required to corresponding flow rate control unit 21. Specifically, for example, the diagonal line part represents a state in which the opening degree of corresponding flow rate control valve 23 is controlled and changed by a value corresponding to the controlled flow rate range and opening/closing valve 24 positioned downstream thereof is opened.

A lattice part represents a state in which a predetermined flow rate of liquid set to corresponding flow rate control unit 21 is being flowed. Specifically, for example, the lattice part represents a state in which the opening degree of flow rate control valve 23 is controlled so that the flow rate of the chemical solution on corresponding flow rate control valve 23 is maintained to the upper limit value of the controlled flow rate range and opening/closing valve 24 positioned downstream thereof is opened.

In the graphs of FIGS. 3 and 4, temporal changes of the flow rate of the chemical solution which flow rate control units 21A, 21B and 21C take charge of are represented by a solid line A, a dot-dashed line B, and a two dot-dashed line C, respectively, and the temporal change of the total flow rate is represented by a broken line T. In the graphs of FIGS. 3 and 4, for easy understanding of the figures, some lines are displayed at positions slightly deviated from an accurate position in order to prevent lines from being overlapped with each other.

When the total flow rate of the chemical solution increases from the minimum flow rate of 10 ml/min to the maximum flow rate of 3100 ml/min which can be implemented by flow rate control unit 20, controls shown in FIGS. 2A and 3 are achieved. First, while opening/closing valves 24B and 24C positioned downstream of flow rate control valve 23B for the medium flow rate and flow rate control valve 23C for the large flow rate are closed, flow rate control valve 23A for the small flow rate is opened at an opening degree corresponding to the required flow rate within the controlled flow rate range and opening/closing valve 24A positioned downstream thereof is opened. Thereafter, the opening degree of flow rate control valve 23A increases depending on the required flow rate until the total flow rate reaches 100 ml/min.

When the total flow rate reaches 100 ml/min (a time t1 of FIG. 3), the required flow rate (target value) of 50 ml/min is provided to controller 26A. As a result, the opening degree of flow rate control valve 23A decreases to decrease the flow rate of the chemical solution passing through flow rate control valve 23A to 50 ml/min. Concurrently, opening/closing valve 24B positioned downstream of flow rate control valve 23B for the medium flow rate which stands by in an opened state at a predetermined opening degree corresponding to the flow rate which is equal to or less than the lower limit value of the controlled flow rate range, is opened and the required flow rate of 50 ml/min is provided to controller 26B. As a result, the opening degree of flow rate control valve 23B increases to increase the flow rate of the chemical solution passing through flow rate control valve 23B to 50 ml/min. That is, while the total flow rate is substantially maintained at 100 ml/min, a state where the flow rate control valve that supplies the chemical solution is only one valve 23A is changed to a state in which the flow rate control valve is two valves 23A and 23B. In this case, while flow rate control valve 23B for the medium flow rate stands by in an opened state at an opening degree corresponding to the lower limit value of the controlled flow rate range, opening/closing valve 24B is able to be opened. However, as described above, opening/closing valve 24B is opened while flow rate control valve 23B for the medium flow rate in an opened state at a predetermined opening degree corresponding to a flow rate which is equal to or less than the lower limit value of the controlled flow rate range and the value corresponding to the lower limit value of the controlled flow rate range may be provided as the required flow rate to controller 26B. Therefore, a decreasing speed of the flow rate of the chemical solution on flow rate control valve 23A and an increasing speed of the flow rate of the chemical solution on flows rate control valve 23B are close to each other to stabilize the total flow rate.

Thereafter, with the increase of the total required flow rate, the required flow rate provided to controller 26A is immediately increased, and as a result, the opening degree of flow rate control valve 23A increases again, such that the total flow rate increases over 100 ml/min. In this case, the flow rate is controlled so that the required flow rate provided to controller 26B is fixed to 50 ml/min to maintain the flow rate of the chemical solution passing through flow rate control valve 23B to 50 ml/min.

When the flow rate of the chemical solution on flow rate control valve 23A for the small flow rate reaches 100 ml/min which is the upper limit value of the controlled flow rate range of flow rate control valve 23A (a time t2 of FIG. 3), the total flow rate reaches 150 ml/min. Continuously, when the total flow rate increases over 150 ml/min, the flow rate of the chemical solution on flow rate control valve 23A is controlled to be maintained at 100 ml/min by fixing the required flow rate provided to controller 26A to 100 ml/min which is the value corresponding to the upper limit value of the controlled flow rate range of flow rate control valve 23A for the small flow rate. In this state, the required flow rate provided to controller 26B is increased, and as a result, the opening degree of flow rate control valve 23B for the medium flow rate increases to thereby increase the flow rate of the chemical solution on flow rate control valve 23B for the medium flow rate.

When the total flow rate reaches 600 ml/min (in this case, the flow rates allotted for flow rate control valves 23A and 23B are 100 ml/min and 500 ml/min, respectively), the required flow rate (target value) of 250 ml/min is provided to controller 26B. As a result, the opening degree of flow rate control valve 23B decreases to decrease the flow rate of the chemical solution passing through flow rate control valve 23B to 250 ml/min (a time t3 of FIG. 3). Concurrently, opening/closing valve 24C positioned downstream of flow rate control valve 23C for the large flow rate which stands by in an opened state at a predetermined opening degree corresponding to the flow rate which is equal to or less than the lower limit value of the controlled flow rate range is opened and the required flow rate (target value) of 250 ml/min is provided to controller 26C. As a result, the opening degree of flow rate control valve 23C increases to increase the flow rate of the chemical solution passing through flow rate control valve 23C to 250 ml/min. That is, while the total flow rate is substantially maintained at 600 ml/min, the state in which two flow rate control valves 23A and 23B are responsible for supplying the chemical solution is changed to a state in which three flow rate control valves 23A, 23B, and 23C are responsible for supplying the chemical solution. Thereafter, with the increase of the total required flow rate, the required flow rate provided to controller 26B is immediately increased. As a result, the opening degree of the flow rate control valve 23B increases again, such that the total flow rate is increased over 600 ml/min. In this case, the flow rate is controlled so that the required flow rate provided to controller 26C is fixed to 250 ml/min to maintain the flow rate of the chemical solution passing through flow rate control valve 23C at 250 ml/min.

When the flow rate of the chemical solution on flow rate control valve 23B for the medium flow rate reaches the upper limit value of the controlled flow rate range, the total flow rate reaches 850 ml/min (a time t4 of FIG. 3). In this case, 100 ml/min is allotted for flow rate control valve 23A, 500 ml/min is allotted for flow rate control valve 23B, and 250 ml/min is allotted for flow rate control valve 23C. Continuously, when the total flow rate increases over 850 ml/min, the flow rate of the chemical solution on flow rate control valve 23B is controlled to be maintained at 500 ml/min by fixing the required flow rate provided to controller 26A to 500 ml/min which is the value corresponding to the upper limit value of the controlled flow rate range of flow rate control valve 23B for the medium flow rate. In this state, the required flow rate provided to controller 26C is increased. As a result, the opening degree of flow rate control valve 23C for the large flow rate increases to increase the flow rate of the chemical solution on flow rate control valve 23C for the large flow rate. When the flow rate of the chemical solution on flow rate control valve 23C for the large flow rate reaches 2500 ml/min which is the upper limit value of the controlled flow rate range, the total flow rate reaches 3100 ml/min.

When the total flow rate of the chemical solution is decreased from the maximum flow rate of 3100 ml/min to the minimum flow rate of 10 ml/min which can be implemented by flow rate control unit 20, controls shown in FIG. 2B and FIG. 4 are achieved. First, the amounts of the chemical solutions on flow rate control valves 23A and 23B are controlled to be maintained at the upper limit values of the respective controlled flow rate ranges by fixing the required flow rates provided to controllers 26A and 26B to the values corresponding to the upper limit values of the controlled flow rate range of flow rate control valve 23A for the small flow rate and flow rate control valve 23B for the medium flow rate. In this state, the required flow rate provided to controller 26C is decreased, and as a result, the opening degree of flow rate control valve 23C for the large flow rate decreases to decrease the flow rate of the chemical solution on flow rate control valve 23C for the large flow rate. When the amount of the chemical solution on flow rate control valve 23C for the large flow rate decreases up to 250 ml/min which is the lower limit value of the controlled flow rate range to decrease the total flow rate up to 850 ml/min (a time t5 of FIG. 4), the flow rate of the chemical solution on flow rate control valve 23C is controlled to be maintained at 250 ml/min by fixing the required flow rate provided to controller 26C to the value corresponding to the lower limit value of flow rate control valve 23C for the large flow rate. In this state, the required flow rate provided to controller 26B is decreased from the value corresponding to the upper limit value of the controlled flow rate range. As a result, the opening degree of flow rate control valve 23B for the medium flow rate decreases to decrease the flow rate of the chemical solution on flow rate control valve 23B.

When the flow rate of the chemical solution on flow rate control valve 23B for the medium flow rate decreases up to 50 ml/min which is the lower limit value of the controlled flow rate range to decrease the total flow rate up to 400 ml/min (in this case, the flow rates allotted for flow rate control valves 23A, 23B and 23C are 100 ml/min, 50 ml/min, and 250 ml/min, respectively), opening/closing valve 24C positioned downstream of flow rate control valve 23C for the large flow rate is closed. At the same time or prior to the closing, the required flow rate of 300 ml/min is provided to controller 26B. As a result, the opening degree of flow rate control valve 23B for the medium flow rate increases to thereby increase the flow rate of the chemical solution passing through flow rate control valve 23B up to 300 ml/min (a time t6 of FIG. 4). As a result, while the total flow rate is substantially maintained with 400 ml/min, the state in which three flow rate control valves 23A, 23B, and 23C are supplying the chemical solution is changed to the state where two flow rate control valves 23A and 23B are used. Thereafter, with the decrease of the required flow rate, the required flow rate provided to controller 26B is immediately decreased. As a result, the opening degree of flow rate control valve 23B decreases again to thereby decrease the total flow rate to a value less than 400 ml/min. Continuously, while decreasing the total flow rate, opening/closing valve 24C positioned downstream of flow rate control valve 23C for the large flow rate continuously maintains the closed state.

When the flow rate of the chemical solution on flow rate control valve 23B for the medium flow rate reaches the value corresponding to the lower limit value of the controlled flow rate range to decrease the total flow rate up to 150 ml/min (in this case, the flow rates allotted for flow rate control valve 23A and 23B are 100 ml/min and control valve 50 ml/min, respectively), the flow rate of the chemical solution on flow rate control valve 23B is controlled to be maintained at the lower limit value of the controlled flow rate range by fixing the required flow rate provided to controller 26B to the lower limit value of the controlled flow rate range of flow rate control valve 23B for the medium flow rate. In this state, the required flow rate provided to controller 26A is decreased from the value corresponding to the upper limit value of the controlled flow rate range of flow rate control valve 23A for the small flow rate. As a result, the opening degree of flow rate control valve 23A decreases to decrease the flow rate of the chemical solution on flow rate control valve 23A (a time t7 of FIG. 4).

When the total flow rate decreases up to 60 ml/min (in this case, the flow rates allotted for flow rate control valves 23A and 23B are 10 ml/min and 50 ml/min, respectively), opening/closing valve 24B positioned downstream of flow rate control valve 23B for the medium flow rate is closed, and at the same time as the closing, the required flow rate provided to controller 26A increases. As a result, the opening degree of flow rate control valve 23A for the small flow rate increase to increase the flow rate of the chemical solution passing through flow rate control valve 23A up to 60 ml/min. As a result, while the total flow rate is substantially maintained at 60 ml/min, the state in which two flow rate control valves are supplying the chemical solution is changed to the state where only one flow rate control valve 23A is used. Thereafter, with the decrease of the total required flow rate, the required flow rate provided to controller 26A is immediately decreased. As a result, the opening degree of flow rate control valve 23A decreases again to decrease the total flow rate to the value less than 60 ml/min. Continuously, while decreasing the total flow rate, opening/closing valve 24B positioned downstream of flow rate control valve 23B for the medium flow rate continuously maintains the closed state. Thereafter, the opening degree of flow rate control valve 23A for the small flow rate is decreased by decreasing the required flow rate provided to controller 26A, and as a result, the total flow rate decreases up to 10 ml/min.

According to the exemplary embodiments of the present disclosure, by combining and using the plurality of flow rate control units 23 (23A, 23B, and 23C) with different controlled flow rate ranges, the controlled flow rate range can be variously widened throughout the liquid flow rate control apparatus. Further, by associating and controlling the operations of the plurality of flow rate control units with different controlled flow rate ranges, the flow rate of the liquid flow rate control apparatus can be changed precisely and smoothly.

In the exemplary embodiment, while increasing the total flow rate of first and second flow rate control units 21A and 21B from a first state in which the liquid does not flow on second flow rate control unit 21B and the liquid flows on first flow rate control unit 21A, when the flow rate (that is, a total flow rate during the first state) of first flow rate control unit 21A increases up to a first value (100 ml/min) within an overlapped range (50 ml/min to 100 ml/min) of the controlled flow rate range (10 to 100 ml/min) of first flow rate control valve 23A and the controlled flow rate range (50 to 500 ml/min) of second flow rate control valve 23B, the first state is changed to a second state in which the liquid flows on first and second flow rate control units 21A and 21B. In this case, the flow rate of first flow rate control unit 21A decreases (from 100 ml/min to 50 ml/min) and the liquid starts to circulate low onto second flow rate control unit 21B so that the total flow rate of first and second flow rate control units 21A and 21B is not changed (maintained at 100 ml/min). As a result, before and after the first state is changed to the second state (before and after the total flow rate becomes 100 ml/min), the total flow rate can be smoothly changed. That is, the overlapped range is set to the controlled flow rate ranges of first and second flow rate control valves 23A and 23B, and the first state is changed to the second state when the total flow rate is within the overlapped range. As a result, the flow rates which first and second flow rate control valves 23A and 23B should achieve immediately after the state changing are within each of the controlled flow rate ranges (the flow rates are, of course, within the controllable flow rate ranges of the flow rate control valves). Therefore, the total flow rate is also high in precision before and after the first state is changed to the second state.

In the exemplary embodiment, while decreasing the total flow rate of first and second flow rate control units 21A and 21B from the second state, when the total flow rate of first and second flow rate control units 21A and 21B decreases up to a second value (60 ml/min) within an overlapped range (60 to 100 ml/min) smaller than the first value (100 ml/min), the second state is changed to the first state. In this case, the flow rate of first flow rate control unit 21A is increased (for example, from 10 ml/min to 60 ml/min) and the liquid stops to flow onto second flow rate control unit 21B so that the total flow rate of first and second flow rate control units 21A and 21B is not changed (maintained at 60 ml/min) As a result, for the same reason as described above, the total flow rate can be smoothly changed before and after the second state is changed to the first state (before and after the total flow rate becomes 60 ml/min) and further, the total flow rate is also high in precision.

The first state and the second state are changed from each other by setting the total flow rate of 100 ml/min as a threshold value (a first threshold value) while increasing the total flow rate of first and second flow rate control units 21A and 21B. In contrast, the first state and the second state are changed from each other by setting the total flow rate of 60 ml/min as a threshold value (a second threshold value smaller than the first threshold value) while decreasing the total flow rate of first and second flow rate control units 21A and 21B. That is, so called a hysteresis control is achieved. Rapid variation of the controlled flow rate of one flow rate control valve at the time of changing the number of operated flow rate control valves undesirably gives a large burden to the flow rate control valve. While the total flow rate is increasing, if a threshold value which causes a state changing trigger is the same, for example, the total flow rate is 100 ml/min, a target total flow rate increases or decreases frequently around 100 ml/min to cause the burden to one flow rate control valve to be excessively increased, but such problem does not occur in the exemplary embodiment.

Even in the relationship between second flow rate control unit 21B and third flow rate control unit 21C, of course, it may be the same as above.

The exemplary embodiment described above is an optimal exemplary embodiment which can be considered in the current situation, but the present disclosure is not limited to the exemplary embodiment.

In the exemplified exemplary embodiment, the controlled flow rate range of flow rate control valve 23A for the small flow rate is in the range of 10 ml/min to 100 ml/min, the controlled flow rate range of flow rate control valve 23B for the medium flow rate is in the range of 50 ml/min to 500 ml/min, and the controlled flow rate range of flow rate control valve 23C for the large flow rate is in the range of 250 ml/min to 2500 ml/min. That is, the lower limit value of the controlled flow rate range of the flow rate control valve having the controlled flow rate range for relatively the large flow rate is one half (½) of the upper limit value of the controlled flow rate range of the flow rate control valve having the controlled flow rate range for relatively the small flow rate. This is advantageous in that the operation when the first state (only flow rate control unit 21A is opened) is changed to the second state (both flow rate control units 21A and 21B are opened) becomes very simple. That is, while the flow rate of the flow rate control valve having the controlled flow rate range for relatively the small flow rate increases up to the upper limit value and thereafter, a target value of one half (½) of the upper limit value of the controlled flow rate range is provided to the controller of the flow rate control valve. At the same time, a target value corresponding to the lower limit value of the controlled flow rate range is provided to the controller of the flow rate control valve having the controlled flow rate range for relatively the large flow rate. In this state, the liquid starts to flow onto the flow rate control valve to achieve a simple state changing. It is evident that even the changing operation from the second state to the first state becomes very simple similarly. However, even though the relationship of the controlled flow rate range is not established, for example, if the controlled flow rate range of flow rate control valve 23A for the small flow rate is in the range of 10 ml/min to 100 ml/min and the controlled flow rate range of the flow rate control valve 23B for the medium flow rate is in the range of 40 ml/min to 500 ml/min, it is evident that the high precision of the total flow rate can be acquired before and after the first state is changed to the second state (alternatively, a state changing opposite thereto) and the total flow rate can be smoothly changed. Further, even in the relationship between second flow rate control unit 21B and third flow rate control unit 21C, of course, it may be the same as above.

In the exemplary embodiment, when the first state (only flow rate control unit 21A is opened) is changed to the second state (both flow rate control units 21A and 21B are opened), the flow rate of the chemical solution on flow rate control valve 23A was increased up to the upper limit value (100 ml/min) of the controlled flow rate range and thereafter, the flow rate of the chemical solution on flow rate control valve 23A was decreased (from 100 ml/min to 50 ml/min). However, after the flow rate of the chemical solution on flow rate control valve 23A is opened at an opening degree corresponding to a value (for example, 90 ml/min) smaller than the upper limit value of the controlled flow rate range, the opening degree of flow rate control valve 23A may be decreased (for example, from 90 ml/min to 40 ml/min) Even in this case, it is evident that the high precision of the total flow rate can be acquired before and after the first state is changed to the second state and the total flow rate can be smoothly changed. Further, even when the second state is changed to the first state, it may also be the same as above. In addition, even in the relationship between flow rate control unit 21B and flow rate control unit 21C, of course, it may be the same as above.

In the exemplary embodiment, when the first state (only flow rate control unit 21A is opened) is changed to the second state (both flow rate control units 21A and 21B are opened), an initial required flow rate provided to controller 26B of flow rate control valve 23B of flow rate control unit 21B corresponds to the lower limit value (50 ml/min) of the controlled flow rate range. Further, when the second state is changed to the first state, a final required flow rate (an opening degree at the time of closing opening/closing valve 24B) provided to controller 26B of flow rate control valve 23B of flow rate control unit 21B also corresponds to the lower limit value (50 ml/min) of the controlled flow rate range. This is advantageous in that the changing operation between the first state and the second state becomes very simple. However, the initial required flow rate and the final required flow rate provided to controller 26B of flow rate control valve 23B may be a value (60 ml/min) higher than the lower limit value of the controlled flow rate range of flow rate control valve 23B. Even in this case, it is evident that the high precision of the total flow rate can be acquired before and after the first state is changed to the second state and the total flow rate can be smoothly changed. Further, even when the second state is changed to the first state, it may be the same as above. In addition, even in the relationship between flow rate control unit 21B and flow rate control unit 21C, of course, it may be the same as above.

In the exemplary embodiment, the 'controlled flow rate range' actually used in each flow rate control valve 23 is set similarly as the 'controllable flow rate range' of each flow rate control valve 23'. However, as described above, if the 'controlled flow rate range' is set within the 'controllable flow rate range', the 'controlled flow rate range' may not coincide with the 'controllable flow rate range'.

In the exemplary embodiment, one flow rate control unit 21A, 21B, or 21C includes flow rate control valve 23 and opening/closing valve 24, but if flow rate control valve 23 itself has a function to completely decrease the flow rate to 0 (a shut-off function), opening/closing valve 24 may be omitted.

In the exemplary embodiment, the liquid (chemical solution) of which the flow rate is adjusted in flow rate control unit (flow rate control apparatus) 20 is mixed with the liquid (DIW) supplied from diluted liquid supply unit 30 to be sent to processing block 100, but is not limited thereto. The liquid of which the flow rate is adjusted in flow rate control unit 20 may also be sent to processing block 100 without being mixed with other liquids.

Flow rate control unit 20 is advantageous by itself in terms of various aspects requiring wide flow rate adjustment. Therefore, a flow rate control target is not limited to the chemical solution and may adopt various liquids. For example, as disclosed in Japanese Patent Application Laid-Open Publication No. 2003-158122, the technology of adjusting the flow rate of a liquid raw material in a CVD device may be adopted. Further, the liquid supplied by cleaning liquid supplying block 1 is not limited to DHF and may be SC1 and SC2. In addition, the substrate processing system may process the substrate by using a processing liquid other than the cleaning liquid. Even in this case, flow rate control unit 20 may be used to control the flow rate of the processing liquid other than the cleaning liquid.

The number of processing units included in the processing system is arbitrary and for example, the processing system may include only one processing unit which is required to widely change the liquid supply amount.

The substrate is not limited to the semiconductor wafer and for example, may be other types of substrates such as a glass substrate for an LCD.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An apparatus for controlling a flow rate of a liquid, comprising:
    a plurality of flow rate control units installed in parallel; and
    a controller configured to control the plurality of flow rate control units so that a total flow rate of liquids that flows on the plurality of flow rate control units becomes a required value of a total flow rate to be implemented by the plurality of flow rate control units,
    wherein the plurality of flow rate control units include at least a first flow rate control unit and a second flow rate control unit,
    the first flow rate control unit includes a first flow rate control valve with a first controlled flow rate range, the second flow rate control unit includes a second flow rate control valve with a second controlled flow rate range, the first controlled flow rate range is smaller than the second controlled flow rate range, and an overlapped range is present between the first controlled flow rate range and the second controlled flow rate range,
    the controller is configured to control the first and second flow rate control units to allow the liquid to flow on either one or both of the first and second flow rate control units depending on variation of the required total flow rate,
    the controller is configured to control the first and second flow rate control units to increase the flow rate at one of the first and second flow rate control units while maintaining the flow rate at the other of the first and second flow rate control units during the course of increasing the total flow rate of the liquid that flows on the first and second flow rate control units, and
    while increasing the total flow rate of the first and second flow rate control units from a first state in which the liquid only flows on the first flow rate control unit, when the flow rate of the first flow rate control unit, that corresponds to the total flow rate at the first state increases up to a first value within the overlapped range, the controller is configured to control the first and second flow rate control units so that the first state is changed to a second state in which the liquid flows both on the first and second flow rate control units, and in this case, the flow rate of the first flow rate control unit decreases and the liquid starts to flow onto the second flow rate control unit so as not to change the total flow rate of the first and second flow rate control units.

2. The apparatus of claim 1, wherein while increasing the total flow rate of the first and second flow rate control units, when changing the first state to the second state, the controller is configured to control the first and second flow rate control units so as to decrease the flow rate of the first flow rate control unit as much as an amount corresponding to a lower limit value of the second controlled flow rate range.

3. The apparatus of claim 1, wherein while increasing the total flow rate of the first and second flow rate control units again after changing the first state to the second state, the controller is configured to control the first and second flow rate control units so as to increase the flow rate of the second flow rate control unit after increasing the flow rate of the first flow rate control unit to a value corresponding to an upper limit value of the first controlled flow rate range.

4. The apparatus of claim 1, wherein while decreasing the total flow rate of the first and second flow rate control units from the second state, when the total flow rate of the first and second flow rate control units decreases up to a second value within the overlapped range smaller than the first value, the controller is configured to control the first and second flow rate control units so that the second state is changed to the first state, and in this case, the flow rate of the first flow rate control unit increases and the flow of liquid onto the second flow rate control unit stops so as not to change the total flow rate of the first and second flow rate control units.

5. The apparatus of claim 4, wherein while decreasing the total flow rate of the first and second flow rate control units, when changing the second state to the first state, the controller is configured to control the first and second flow rate control units so as to decrease the flow rate of the second flow rate control unit to the value corresponding to the lower limit value of the second controlled flow rate range and increase the flow rate of the first flow rate control unit as much as the amount corresponding to the lower limit value of the second controlled flow rate range.

6. The apparatus of claim 1, wherein the lower limit value of the second controlled flow rate range is equal to one half ($\frac{1}{2}$) of the upper limit value of the first controlled flow rate range.

7. The apparatus of claim 1, wherein the plurality of flow rate control units further include a third flow rate control unit, the third flow rate control unit includes a third flow rate control valve with a third controlled flow rate range, and the third controlled flow rate range is larger than the second controlled flow rate range and has an overlapped range with the second controlled flow rate range, or is smaller than the first controlled flow rate range and has an overlapped range with the first controlled flow rate range.

8. The apparatus of claim 1, further comprising:
    a common liquid supply unit supplying the liquid to the plurality of flow rate control units installed in parallel,
    wherein each flow rate control unit includes a pipe, a flowmeter and a flow rate control valve installed on the pipe, and a controller controlling an opening degree of the flow rate control valve to achieve a target flow rate based on a deviation between the target flow rate provided from the controller and a measurement value of the flowmeter.

9. The apparatus of claim 8, wherein the each flow rate control unit further includes an opening/closing valve installed on the pipe and the flow rate control valve is a needle valve.

10. A method for controlling a flow rate of a liquid using a plurality of flow rate control units, which includes at least a first flow rate control unit and a second flow rate control unit installed in parallel, so that a total flow rate of the liquid that flows on the plurality of flow rate control units becomes a required value of the total flow rate to be implemented by the plurality of flow rate control units, wherein the first flow rate control unit includes a first flow rate control valve with a first controlled flow rate range, the second flow rate control unit includes a second flow rate control valve with a second controlled flow rate range, the first controlled flow rate range is smaller than the second controlled flow rate range, and an overlapped range is present between the first controlled flow rate range and the second controlled flow rate range, the method comprising:
    flowing the liquid on either any one or both of the first and second flow rate control units depending on the change of the required value of the total flow rate to be implemented by the plurality of flow rate control units; and
    maintaining the flow rate that flows on any one of the first and second flow rate control units and increasing the flow rate that flows on the other one while increasing the total flow rate of the liquids that flows on the first and second flow rate control units, wherein while increasing the total flow rate of the first and second flow rate control units from a first state in which the liquid does not flow on the second flow rate control unit and the liquid flows on the first flow rate control unit, and when the flow rate of the first flow rate control unit that corresponds to the total flow rate increases up to a first value within the overlapped range, the method further comprising:

changing the first state to a second state in which the liquid flows on the first and second flow rate control units; and decreasing the flow rate of the first flow rate control unit and initiating the flow of liquid onto the second flow rate control unit, thereby fixing the total flow rate of the first and second flow rate control units.

11. The method of claim 10, while increasing the total flow rate of the first and second flow rate control units, and when changing the first state to the second state, the method further comprising decreasing the flow rate of the first flow rate control unit as much as an amount corresponding to a lower limit value of the second controlled flow rate range.

12. The method of claim 10, while increasing the total flow rate of the first and second flow rate control units again after changing the first state to the second state, the method further comprising increasing the flow rate of the second flow rate control unit after increasing the flow rate of the first flow rate control unit to a value corresponding to an upper limit value of the first controlled flow rate range.

13. The method of claim 10, while decreasing the total flow rate of the first and second flow rate control units from the second state, and when the total flow rate of the first and second flow rate control units decreases up to a second value within the overlapped range smaller than the first value, the method further comprising:

changing the second state to the first state; and increasing the flow rate of the first flow rate control unit and halting the flow of liquid onto the second flow rate control unit, thereby fixing the total flow rate of the first and second flow rate control units.

14. The method of claim 13, while decreasing the total flow rate of the first and second flow rate control units, and when changing the second state to the first state, the method further comprising increasing the flow rate of the first flow rate control unit as much as the amount corresponding to the lower limit value of the second controlled flow rate range when the flow rate of the second flow rate control unit decreases to the value corresponding to the lower limit value of the second controlled flow rate range.

15. The method of claim 10, wherein the lower limit value of the second controlled flow rate range is equal to one half (½) of the upper limit value of the first controlled flow rate range.

16. The method of claim 10, the method further comprising providing the plurality of flow rate control units with a third flow control unit including a third flow rate control valve with a third controlled flow rate range, wherein the third controlled flow rate range is larger than the second controlled flow rate range and has an overlapped range with the second controlled flow rate range, or is smaller than the first controlled flow rate range and has an overlapped range with the first controlled flow rate range.

17. A non-transitory computer-readable storage medium storing a program for controlling a liquid flow rate control apparatus including a plurality of flow rate control units, which includes at least a first flow rate control unit and a second flow rate control unit installed in parallel, in which the first flow rate control unit includes a first flow rate control valve with a first controlled flow rate range, the second flow rate control unit includes a second flow rate control valve with a second controlled flow rate range, the first controlled flow rate range is smaller than the second controlled flow rate range and an overlapped range is present between the first controlled flow rate range and the second controlled flow rate range, wherein the program, when executed by a control computer, controls the plurality of flow rate control units to perform the steps of:

controlling a total flow rate of liquids that flows on the plurality of flow rate control units to become a required value of a total flow rate to be implemented by the plurality of flow rate control units;

flowing the liquid on either any one or both of the first and second flow rate control units depending on variation of the required value of the total flow rate to be implemented by the plurality of flow rate control units; and maintaining the flow rate that flows at one of the first and second flow rate control units and increasing the flow rate that flows at the other of flow rate control units while increasing the total flow rate of the liquids that flows on the first and second flow rate control units, wherein while increasing the total flow rate of the first and second flow rate control units from a first state in which the liquid does not flow on the second flow rate control unit and the liquid flows on the first flow rate control unit, and when the flow rate of the first flow rate control unit that corresponds to the total flow rate increases up to a first value within the overlapped range, the steps further comprising:

changing the first state to a second state in which the liquid flows on the first and second flow rate control units; and decreasing the flow rate of the first flow rate control unit and initiating the flow of liquid onto the second flow rate control unit, thereby fixing the total flow rate of the first and second flow rate control units.

* * * * *